(12) United States Patent
Mazzola et al.

(10) Patent No.: US 8,384,182 B2
(45) Date of Patent: Feb. 26, 2013

(54) JUNCTION BARRIER SCHOTTKY RECTIFIERS HAVING EPITAXIALLY GROWN P+-N METHODS OF MAKING

(75) Inventors: Michael S. Mazzola, Starkville, MS (US); Lin Cheng, Starkville, MS (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 12/146,580

(22) Filed: Jun. 26, 2008

(65) Prior Publication Data

US 2008/0251793 A1 Oct. 16, 2008

Related U.S. Application Data

(62) Division of application No. 11/396,615, filed on Apr. 4, 2006, now abandoned.

(51) Int. Cl.
*H01L 27/095* (2006.01)
(52) U.S. Cl. ............ 257/475; 257/77; 257/471; 257/485
(58) Field of Classification Search .................... 257/77, 257/449, 471–486
See application file for complete search history.

(56) References Cited

U.S. PATENT DOCUMENTS

| | | | |
|---|---|---|---|
| 4,982,260 A | | 1/1991 | Chang et al. |
| 5,072,287 A | * | 12/1991 | Nakagawa et al. ............ 257/500 |
| 5,204,277 A | * | 4/1993 | Somero et al. ................. 438/366 |
| 6,091,108 A | * | 7/2000 | Harris et al. ................... 257/339 |
| 6,104,043 A | * | 8/2000 | Hermansson et al. .......... 257/77 |
| 6,429,102 B1 | * | 8/2002 | Tsai et al. ...................... 438/508 |
| 6,524,900 B2 | | 2/2003 | Dahlqvist et al. |
| 6,767,783 B2 | | 7/2004 | Casady et al. |
| 6,897,133 B2 | | 5/2005 | Collard |
| 6,936,850 B2 | * | 8/2005 | Friedrichs et al. .............. 257/77 |
| 7,615,839 B2 | * | 11/2009 | Souma et al. .................. 257/473 |

FOREIGN PATENT DOCUMENTS

| | | |
|---|---|---|
| JP | 11330498 | 11/1999 |
| WO | 9727629 | 7/1997 |
| WO | 0148827 A1 | 7/2001 |

OTHER PUBLICATIONS

Alexandrov, P. et al., "Demonstration of High Voltage (600-1300 V), High Current (10-140 A), Fast Recovery 4H-SiC p-i-n/Schottky (MPS) Barrier Diodes," Sol. State Electron., vol. 47, pp. 263-269, 2003.

Chen, Y., "Homoepitaxial Growth of 4H-SiC on Trenched Substrates by Chemical Vapor Deposition," Materials Science Forum, vols. 457-460, pp. 189-192, 2004.

(Continued)

*Primary Examiner* — Ori Nadav
(74) *Attorney, Agent, or Firm* — Morris, Manning & Martin, LLP; Christopher W. Raimund (57) ABSTRACT

A junction barrier Schottky (JBS) rectifier device and a method of making the device are described. The device comprises an epitaxially grown first n-type drift layer and p-type regions forming $p^+$-n junctions and self-planarizing epitaxially over-grown second n-type drift regions between and, optionally, on top of the p-type regions. The device may include an edge termination structure such as an exposed or buried $P^+$ guard ring, a regrown or implanted junction termination extension (JTE) region, or a "deep" mesa etched down to the substrate. The Schottky contact to the second n-type drift region and the ohmic contact to the p-type region together serve as an anode. The cathode can be formed by ohmic contact to the n-type region on the backside of the wafer. The devices can be used in monolithic digital, analog, and microwave integrated circuits.

26 Claims, 8 Drawing Sheets

OTHER PUBLICATIONS

Cheng, L., "Cryogenic and High Temperature Performance of 4H-SiC Vertical Junction Field Effect Transistors (VJFETs) for Space Applications," Proceedings of the 17th International Symposium on Power Semiconductor Devices & IC's, May 23-26, 2005.

Dahlquist, F. et al., "A JBS Diode with Controlled Forward Temperature Coefficient and Surge Current Capability," Materials Science Forum, vol. 389-393, pp. 1129-1132, 2002.

Merrett, J.N., "Gamma and Proton Irradiation Effects on 4H-SiC Depletion-Mode Trench JFETs," Materials Science Forum, vols. 483-485, pp. 885-888, 2005.

Neamen, D.A., "Semiconductor Physics and Devices-Basic Principles," Published by Richard D. Irwin, Inc., (ISBN 0-256-08405-X), pp. 342-345, 1992.

Nordell, N. et al, "Homoepitaxy of 6H and 4H SiC on Nonplanar Substrates," Appl. Phys. Lett., vol. 72(2), pp. 197-199, 1998 (Abstract only).

Onda, S. et al., "SiC Integrated MOSFETs," Phys. Stat. Sol. (a), 162(1), pp. 369-388, 1997 (Abstract only).

Palmour, J.W., "Low-frequency Noise in 4H-silicon Carbide Junction Field Effect Transistors," Appl. Phys. Lett, vol. 68(19), pp. 2669-2671, 1996 (Abstract only).

Rottner, K. et al., "SiC Power Devices for High Voltage Applications," Mat. Sci. Eng., B61-62, pp. 330-338, 1999.

Shenai, K. et al., "Optimum Semiconductors for High-Power Electronics," IEEE Transactions on Electron Devices, vol. 36(9), pp. 1811-1823, 1989.

Singh, R. et al., "1500 V, 4 Amp 4H-Sic JBS Diodes," Proceedings of the 12th International Symposium on Power Semiconductor Devices and ICs (ISPSD '2000), Toulouse, France, May 22-25, 2000.

P.A. Losee, et al., "Improving Switching Characteristics of 4H-SiC Junction Rectifiers Using Epitaxial and Implanted Anodes With Epitaxial Refill," Materials Science Forum vols. 527-529 (2006), pp. 1363-1366.

Merrett, J.N., "Silicon Carbide Vertical Junction Field Effect Transistors Operated at Junction Temperatures Exceeding 300°C," Dept. Of Electrical and Computer Engineering, Mississippi State University (5 pgs.) Jul. 8, 2005.

Neudeck, P.G. et al., "600°C Logic Gates Using Silicon Carbide JFET's," NASA/TM-2000-209928, National Aeronautics and Space Administration, Glenn Research Center, pp. 1-4, Mar. 20, 2000.

* cited by examiner

JUNCTION BARRIER SCHOTTKY RECTIFIERS HAVING EPITAXIALLY GROWN P+-N METHODS OF MAKING

This application is a divisional application of U.S. patent application Ser. No. 11/396,615, filed on Apr. 4, 2006, pending, which is incorporated by reference herein in its entirety.

STATEMENT REGARDING FEDERALLY SPONSORED RESEARCH

This invention was made with U.S. Government support under Air Force Research Laboratory Agreement No. F33615-01-D-2103. The U.S. Government may have certain rights in this invention.

BACKGROUND

1. Technical Field

The present invention relates, in general, to junction barrier Schottky rectifiers or diodes with a vertical $p^+$-n junction and, in particular, to such devices having an epitaxially grown drift layer and epitaxially overgrown drift regions forming a $p^+$-n junction which may or may not be buried and self-planarized Schottky contact regions. The devices can be formed in a wide band-gap semiconductor material such as silicon carbide.

2. Background of the Technology

Silicon Carbide (SiC), a wide band-gap semiconductor material, is very attractive for use in high-power, high-temperature, and/or radiation resistant electronics. SiC power switches are logical candidates for these applications due to their excellent material physical properties such as wide energy band-gap, high breakdown field strength, high saturated electron drift velocity and high thermal conductivity compared to the conventional silicon counter part. In addition to the above advantages, SiC power devices can operate with lower specific on-resistance than conventional silicon power devices [1]. SiC unipolar devices are expected to replace Si bipolar switches and rectifiers in the 600-3000 V range in the very near feature.

Generally speaking, there are three types of rectifiers [2]: (1) Schottky diodes, which offer a low effective turn-on voltage hence low on-state losses and extremely high switching speed due to primarily majority carrier conduction resulting in no diffusion capacitance [3] and thereby no real reverse recovery on turning off as well as no forward voltage overshoot on turning on, but suffer from high leakage current; (2) P-i-N diodes, which offer low leakage current but show reverse recovery charge during switching; and (3) Junction Barrier Schottky (JBS) diodes which offers Schottky-like on-state and switching characteristics, and PiN-like off-state characteristics by screening the Schottky surface from the high electric field [4]. In conventional high voltage (>600 V) circuits using Si PiN diodes, the primary source of power loss is the dissipation of reverse recovery charge during the turn-off of the rectifier. A fast recovery from SiC JBS diodes allows the design of packages with much lower thermal requirements for both the rectifier and the switch, and is expected to increase in the power density of circuits by >3x.

Because of the fundamental differences in material properties and processing technologies, traditional Si or GaAs microelectronics technologies in power rectifiers (or diodes) can not be easily transferred to SiC. A number of reports of SiC rectifiers have appeared in the last several decades (e.g., [2-6]).

U.S. Pat. No. 4,982,260 describes defining p-type emitter regions by etching through a heavily doped p-type well created by diffusion. However, since diffusion of dopants into SiC occurs very slowly at even extremely high temperatures, as a practical matter, a p-type well can only be formed in n-type SiC by ion implantation which can result in low minority carrier lifetime due to damage caused by implantation.

An example of a SiC Junction Barrier Schottky (JBS)/Merged P-I-N Schottky (MPS) grid can be found in U.S. Pat. No. 6,524,900 B2. This device has Schottky metal deposited on implanted p-type islands defined by plasma etching through an epitaxially grown layer. However, this structure is unable to effectively protect itself from a surge current in case of absence of p-type ohmic contacts on p-type regions and insufficient conductivity modulation caused by low doping of p-type regions.

An example of a junction barrier rectifier employing an implanted $P^+$ region to form p-n junction can be found in U.S. Pat. No. 6,104,043. In this case, although Ohmic contacts are formed on heavily doped implanted p-type regions, the conductivity modulation in the drift region of such a structure suffers from low minority carrier lifetime caused by residual implantation damages even after high-temperature thermal anneal.

To date, most of the obstacles to low-cost volume manufacturing can be traced back to the $p^+$-n junction level process steps. Also, the heavily doped p-type region for Ohmic contact can be difficult to fabricate in SiC because of the large band-gap of SiC. To obtain an abrupt $p^+$-n junction for both conductivity modulation and Ohmic contact in SiC junction barrier Schottky diodes, ion implantation is often used to form the $P^+$ region. Damage induced during ion implantation and post implantation anneal at very high temperatures (e.g., temperatures>=1500° C.) can cause the reverse leakage current of p-n junction to increase and tend to degrade the surface of SiC on which the Schottky contact is to be made. Damage resulting from these processing steps can greatly affect device performance including forward conduction and blocking capability. It is also difficult to have a precise control of $p^+$-n junction depth by ion implantation because of a combination of uncertainties on actual depth profile of implantation tail, defect density, redistribution of implanted ions after annealing, and ionization percentage of dopant atoms and point defects under different bias and/or temperature stress.

To eliminate these drawbacks, alternative methods of forming a $p^+$-n junction can be used. One method is to selectively grow $P^+$ gate regions epitaxially as disclosed in U.S. Pat. No. 6,767,783. Another method of forming a $p^+$-n junction is to epitaxially regrow a $P^+$ layer on top of an trench-etched $N^-$ drift layer, followed by a plasma etch-back or chemical-mechanical polishing or other planarization method to expose the $N^-$ drift region for Schottky metal contact. A similar method is disclosed in U.S. Pat. No. 6,897,133 B2. In the device described in this reference, however, lightly doped P regions are used to form the p-n junction. Also in this device, the epitaxially grown p-type regions do not form JFET regions that may significantly limit current conduction under both normal and surge current operating conditions.

Accordingly, there still exists a need for improved methods of manufacturing semiconductor devices.

SUMMARY

According to a first embodiment, a semiconductor device is provided which comprises:
a substrate layer comprising a semiconductor material of a first conductivity type;

an optional buffer layer comprising a semiconductor material of the first conductivity type on the substrate layer, a drift layer on the substrate layer or buffer layer, the drift layer comprising a semiconductor material of the first conductivity type;

a central region comprising a plurality of regions of semiconductor material of a second conductivity type different than the first conductivity type on a central portion of the drift layer, the regions of semiconductor material of the second conductivity type having upper surfaces and sidewalls; and an epitaxially over-grown drift region of semiconductor material of the first conductivity on the drift layer adjacent the plurality of regions of semiconductor material of the second conductivity type and, optionally, on upper surfaces of the plurality of regions of semiconductor material of the second conductivity type.

According to a second embodiment, an integrated circuit is provided which comprises:

a semiconductor device as set forth above; and at least one additional electronic power component formed on the substrate layer.

According to a third embodiment, a method of making a semiconductor device is provided which comprises:

selectively etching through a layer of semiconductor material of a second conductivity type on a drift layer of semiconductor material of a first conductivity type different than the second conductivity type to expose material of the drift layer thereby forming a central region comprising a plurality of regions of semiconductor material of the second conductivity type on the drift layer, the regions of semiconductor material of the second conductivity type having upper surfaces and sidewalls;

epitaxially over-growing a drift region of semiconductor material of the first conductivity type on exposed surfaces of the drift layer adjacent to the regions of semiconductor material of the second conductivity type and on upper surfaces of the regions of semiconductor material of the second conductivity type; and etching the drift region to expose at least a portion of the upper surfaces of the regions of semiconductor material of the second conductivity type;

wherein the drift layer is on a semiconductor substrate or wherein the drift layer is on a buffer layer comprising a semiconductor material of the first conductivity type and wherein the buffer layer is on the semiconductor substrate.

A device made by the above described method is also provided.

REFERENCE NUMERALS

1. Substrate
2. N+ buffer layer
3. N-type drift layer
4. P-type regions (e.g., fingers)
5. P-type bus-bar for metal contacts
6. (a) P-type passivated guard rings; (b) P-type buried guard rings; (c) P-type epitaxially re-grown or implanted JTE region; (d) mesa edge termination etched through all epitaxial layers down to the substrate
7. P-type trenches
8. N-type self-planarized drift region
9. Isolation dielectric and Passivation dielectric
10. Anode metal contacts on the exposed P+ regions and N-type drift region
11. Backside Cathode metal contact

DETAILED DESCRIPTION

An object of the present invention is to provide a Junction Barrier Schottky (JBS) rectifier with all epitaxially grown single or dual drift regions including a self-planarized $2^{nd}$ drift region and buried or exposed p+-n junction with P+ guard rings or JTE with or without a N+ field stop region or "deep" mesa edge termination in SiC, that can be made electrically isolated from the other devices fabricated on the same die, and that can be implemented in such a way that the devices fabricated on the same die may be monolithically integrated with other electronic power components, for example junction field-effect transistors (JFETs) or bipolar junction transistors (BJTs).

A further object of the invention is to provide the concept and an example of planarization of trenched P+ region by homo-epitaxial over-growth of the $2^{nd}$ lightly doped N− drift regions on a patterned silicon carbide substrate.

A further object of the invention is to provide the concept and an example of planarization of trenched P+ region by homo-epitaxial over-growth of only the $2^{nd}$ lightly doped N− drift regions on a silicon carbide patterned substrate.

A further object of the invention is to provide a method of the fabrication of the above devices.

Methods of forming a p+-n junction and devices made by these methods are described herein. According to one embodiment, the method comprises epitaxially growing a P+ layer on top of a flat first N− drift layer, followed by an etch-back of the P+ layer down to the drift region to form a patterned P+ layer comprising elongate P+ regions (i.e., fingers) and, optionally, one or more bus-bars. According to one embodiment, the bus-bars can connect all of the P+ fingers together around the periphery of the device to permit external metal contact to the Schottky contact metal thus permitting forward biasing of the buried p+-n junction structure which will provide conductivity modulated current for surge protections.

The devices may comprise an edge termination structure. Edge termination methods include, but are not limited to, P+ guard rings, P-type junction termination extension (JTE) by either epitaxial growth or ion implantation, or "deep" mesa edge termination (i.e.: mesa etched down through all epitaxial N− drift and P+ layers into the N+ substrate).

A second n-type drift region is then over-grown on the patterned P+ region and the exposed first N− drift layer. The doping concentration of the re-grown second N− drift region can be different from that of the first N− drift layer. For example, there is a trade-off between lower leakage current but higher on-resistance ($R_{on}$) or higher on-state voltage drop ($V_F$) from lower N− drift doping concentration. The trade-off of this design may be partially cancelled by re-growing the second N− drift region with higher doping concentration than that of the first N− drift layer. Alternatively, the second N− drift region may be more lightly doped than the first N− drift layer.

The following advantages can be realized by using an epitaxially grown P-type region instead of an implanted P-type region:

Precisely and readily controlled vertical p+-n junction dimensions, including a greater depth of the p region than is physically possible with implantation (usually <0.5 μm for high KeV implantation versus >1 μm for an epitaxial process) which permits considerably better optimization of the design trade between the reverse blocking performance and the forward conduction performance (on-resistance) of the JBS rectifier;

Flexible and convenient to add an optional p-type external "bus bar" when creating the P+ trenches. The p-type external "bus bar" can connect to all the p-type fingers, which can be either buried into the over-grown N− drift region or exposed to metal contact, in order to reduce the gate resistance hence improve switching performance of the JBS rectifier;

Heavily doped p-type material for efficient conductivity modulation can be achieved without a high-temperature post anneal, which would eliminate surface degradation of the SiC Schottky contact area by the high-temperature anneal (>1500° C.) thus improving the ideality and performance of the Schottky diode while simultaneously improving the conductivity modulation of the p+-n diode.

Freedom to form abrupt and/or graded p-n junction for reliably grading the electrical field in the vicinity of the p-n junction without degrading the efficiency of conductivity modulation.

The p-n junction regions are free of implantation damage and implantation straggle. This results in (1) easy fabrication of abrupt and/or graded p-n junctions for easy depletion and improved minority carrier life time hence improved conductivity modulation, (2) avoidance of problems due to unexpected variation of the structure (meaning doping and geometry) of the p-n junction by implantation, and (3) reliable grading of the electric field in the vicinity of the p-n junction.

A more robust and reliable p+-n junction reduces the reverse leakage current, and the shift of the threshold voltage with temperature.

The elimination of concern for incomplete activation of the implanted P-type dopant and about the creation of unintended implantation-induced defects, resulting in a significantly higher yield and hence a reduced manufacturing cost.

The following advantages of re-growing an N− drift layer on top of structured P+ regions to form a p+-n junction, as described herein, can be realized with respect to re-growing a P+ layer on top of structured N− drift regions followed by etch back to expose the N− drift region:

Freedom to dope the $2^{nd}$ drift layer different from the $1^{st}$ drift layer, in order to have both on-resistance (or $V_F$) and leakage current (or blocking capability) optimized to improve the device performance.

Flexibility with the follow-on processing of the $2^{nd}$ re-grown N− layer to either expose the P+ regions by etching back the $2^{nd}$ N⁻ layer to the P⁺ region for an enhanced "surge-current-protected" JBS diode or to leave the P⁺ semiconductor buried but use an external P⁺ bus-bar for Ohmic contact formation to lower the cost of fabrication while still maintaining a degree of surge-current capability in a high-voltage rated JBS diode.

Since the relative area of the Schottky-contacted N⁻ region versus the P⁺ region is one of the factors that determine the $R_{on}$ or $V_F$, a narrower P⁺ structure results in more Schottky area hence lower $R_{on}$ and $V_F$. In addition, wider spacing or more Schottky area between the two adjacent P⁺ regions can also help to reduce the peak current density, providing better surge-current protection. When filling the structured N⁻ drift layer with the P⁺ region to form the p-n junction, the width of the trench through the N⁻ area needs to be large enough to allow a reasonable aspect ratio for the re-grown P⁺ to planarize and be free of key-holes (i.e., voids that form in the semiconductor during re-growth due to an excessive aspect ratio). In contrast, this disclosure teaches re-growing the N⁻ drift layer on the structured P⁺ regions, so that the latter can be made smaller or narrower using conventional photo-lithography or any other available techniques than that made by re-growing P⁺ on the structured N⁻ drift regions.

Self-planarized re-growth of the second N⁻ drift region on the structured P⁺ regions can be easily achieved by optimizing the P⁺ trench crystallographic orientation as described in U.S. patent application Ser. No. 11/198,298, filed on Aug. 8, 2005, which is incorporated by reference herein. In this embodiment, the second re-grown N⁻ layer is etched back to expose the P⁺ regions for ohmic contact formation, because the self-planarization effect provided by the epitaxial re-growth process specified in the '298 application permits the trenches made in the P⁺ layer to be filled in by the second N⁻ drift region with reduced residual undulation, they can be wider (i.e., they have lower aspect ratio) than those in which trenches in the N⁻ drift layer are filled in with the P⁺ layer. In this manner, the post-epi planarization and patterning required to achieve continuous coverage of the follow-on metallization processes can be simplified.

Once the second N⁻ drift region fills in the P⁺ trenches and over-grows on top of the structured epitaxial P⁺ regions, it can be patterned and etched back to expose either all the P⁺ regions or only the bus-bars which connect to all the buried P⁺ fingers for external metal contacts. An edge termination structure can then be formed. Edge termination structures can be formed by a selectively re-grown or implanted p-type JTE region with or without N⁺ field-stop region, "deep" mesa etched through all epitaxial layers down to the N⁺ substrate, or P⁺ guard rings. Metal layers are then applied on top of the second N⁻ drift region to form a Schottky contact and on top of the exposed P⁺ region to form an Ohmic contact, and backside of the substrate to form an Ohmic contact. Finally, thick metal layers can be applied on top of both Schottky and Ohmic contacts to form the anode of the diode and on the backside Ohmic contact to form the cathode of the diode. The schedule of the Ohmic contact formation in the sequence just described, which may require a high-temperature anneal, is such that the electrical properties of the Schottky contact are not compromised.

The P⁺ trench depth or finger height, the P⁺ finger width, the distance between two adjacent P⁺ fingers for the second N⁻ region to fill in, and the doping concentration of the first drift layer and the second drift region can be selected according to formulae known to those schooled in the art to have low $R_{on}$ and $V_F$ while still making the depletion of the drift layer continuous among all the P⁺ regions in the off-state to screen the high electrical field in the depletion region from the Schottky barrier existing at the surface-interface of the Schottky metal and the second N⁻ drift region.

Considering the effect of surface topology on the photolithography and metal contact steps remaining after overgrowth of the second N⁻ drift region, it is preferable to have the second drift region reasonably planar on top of the structured P⁺ regions. However, the alternating trenches and P⁺ fingers normally work against the planar growth of a regrown epitaxial layer. A method for self-planarized epitaxial re-growth which can be used to form the second N⁻ drift region is described in U.S. patent application Ser. No. 11/198,298, which is incorporated by reference herein. Furthermore, by optimizing the P⁺ trench depth or finger height, the P⁺ finger width, the separation between two adjacent P⁺ fingers for the second N⁻ drift region to fill in, the self-planarized second n-type drift regions can be homoepitaxially over-grown free of key-holes (i.e., free of voids or inclusions in the single-crystal epitaxial material) on the trenched P⁺ regions.

According to further embodiments, the disclosed JBS rectifiers can be monolithically integrated with other electronic power components, such as JFETs or BJTs (Bipolar Junction Transistors) or MOSFETs or gate turn-off thyristors (GTOs) in SiC. These monolithic devices can be made by selective or blanket re-growth of one or more n-type and/or p-type layers, for example a third N⁺ layer grown on top of the second drift region to form a junction field-effect transistor on the same die with the JBS rectifiers, where the source and channel regions can be defined by a selective plasma etch-back of the N⁺ and the second N⁻ drift regions.

The device can be built on a silicon carbide substrate, which can be electrically either p-type or n-type with or without an epitaxially grown buffer layer of the same conductivity type. For n-type substrates, the device comprises an epitaxially grown first n-type drift and then a p-type trenched region, followed by an epitaxially re-grown n-type planarized second drift region which may have the same or different doping concentration from the first drift layer. The device structure is defined using conventional photolithography and plasma dry-etch. The Schottky contact to the n-type drift region and Ohmic contact to the p-type region are formed on top of the wafer, while the Ohmic contact to the heavily doped substrate is formed on the backside of the wafer. Depending on the lateral distance between the two adjacent p-type regions, the proposed JBS diode may have different on- and off-state characteristics, and can be implemented for both punch-through and non-punch-through modes of off-state operation for the same n-type doping of the second drift region. In addition, the devices described above, can be used in monolithic microwave integrated circuits (MMICs). Moreover, the devices described above can be fabricated monolithically with other power electronic components on the same wafer or die for use in power switching or converter or booster circuits.

Silicon carbide crystallizes in more than 200 different poly-types. The most important are: 3C-SiC (cubic unit cell, zincblende); 2H-SiC; 4H-SiC; 6H-SiC (hexagonal unit cell, wurtzile); and 15R-SiC (rhombohedral unit cell). However, the 4H-polytype is more attractive for power devices thanks to its larger bandgap and higher electron mobility. Although the 4H-SiC is preferred, it is to be understood that the present invention is applicable to devices and integrated circuits described herein made of other poly-types of silicon carbide.

The semiconductor device and method will be described in greater detail hereafter with reference to the accompanying drawings, in which embodiments of the invention are described using silicon carbide (SiC) as a semiconductor material.

Figure 1A:
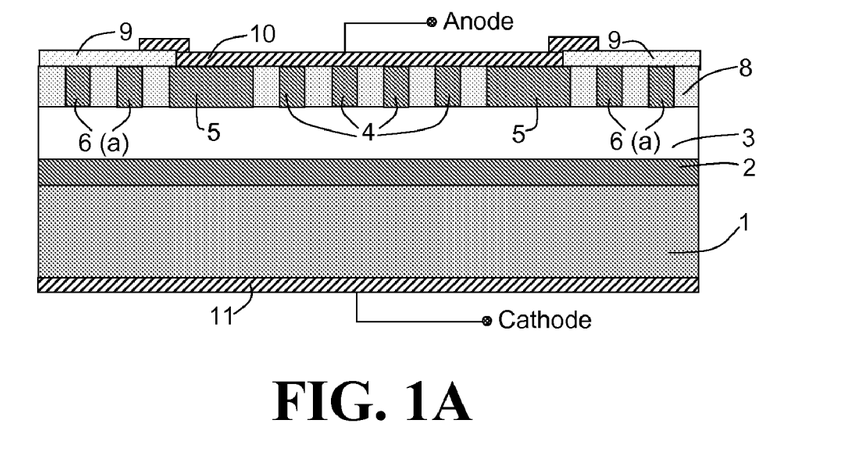
FIG. 1A is an schematic two-dimensional illustration of a JBS rectifier according to one embodiment having exposed $P^+$ finger, bus-bar, and guard ring regions.
Figure 1B:
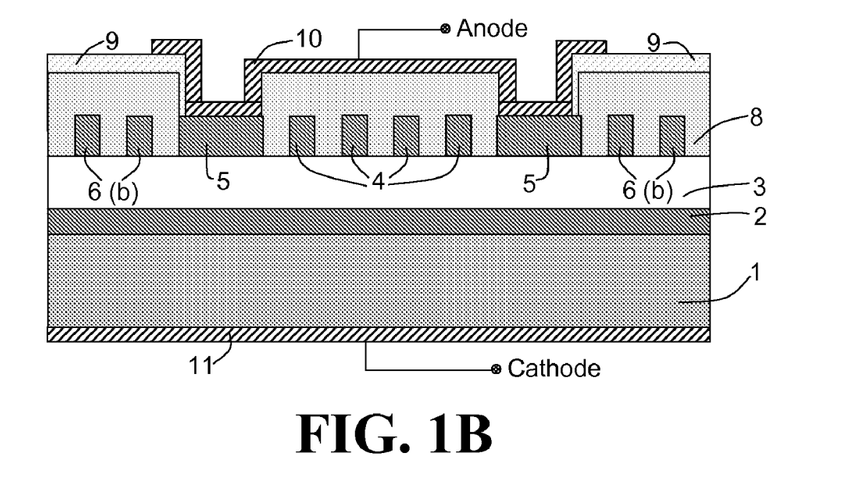
FIG. 1B is an schematic two-dimensional illustration of a JBS rectifier according to one embodiment having only the $P^+$ bus-bar regions exposed and having buried $p^+$-n junctions and guard rings.

FIGS. 1A-1D are schematic two-dimensional views of a semiconductor device referred to as a Junction Barrier Schottky (JBS) rectifier illustrating different edge termination structures. As shown in FIGS. 1A-1D, the device is built on a silicon carbide substrate 1, which can be electrically either p-type or n-type, with or without an epitaxially grown buffer layer 2 of the same conductivity type. When an n-type substrate is used, the device comprises an epitaxially grown first n-type drift layer 3 and then a p-type trenched region 4, followed by an epitaxially re-grown n-type self-planarized second drift region 8 which may have the same or different doping concentration from the first drift layer. As shown, the p-type region comprises bus bars 5. The device structure can be defined using conventional photolithography and plasma dry-etch. Metal forming the Schottky contact on the second drift region is connected to the Ohmic contacts on the exposed p-type regions to form a continuous anode 10 on top of the wafer while a cathode 11 is formed by Ohmic contact to the n-type region on the backside of the substrate. As shown in FIGS. 1A and 1B, the P$^+$ guard ring regions 6(*a*) and 6(*b*) can be either exposed to the passivation dielectric layer 9 as shown in FIG. 1A or buried into lightly n-type drift region 8 as shown in FIG. 1B.

Figure 1C:
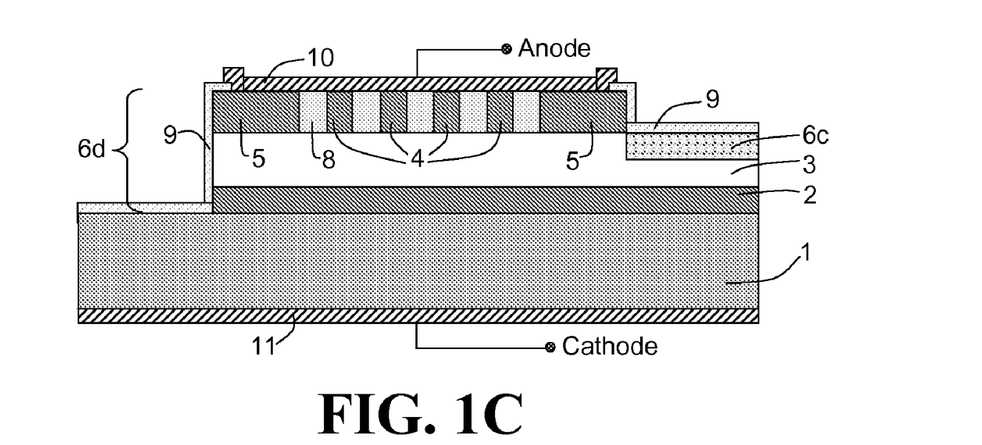
FIG. 1C is an schematic two-dimensional illustration of a JBS rectifier according to one embodiment having exposed $P^+$ finger and bus-bar regions and showing junction termination extension (JTE) and mesa edge termination.

FIG. 1C is a schematic two-dimensional illustration of a JBS rectifier having exposed P$^+$ finger and bus-bar regions. FIG. 1C also illustrates both junction termination extension (JTE) 6*c* and mesa edge termination 6*d* structures.

Figure 1D:
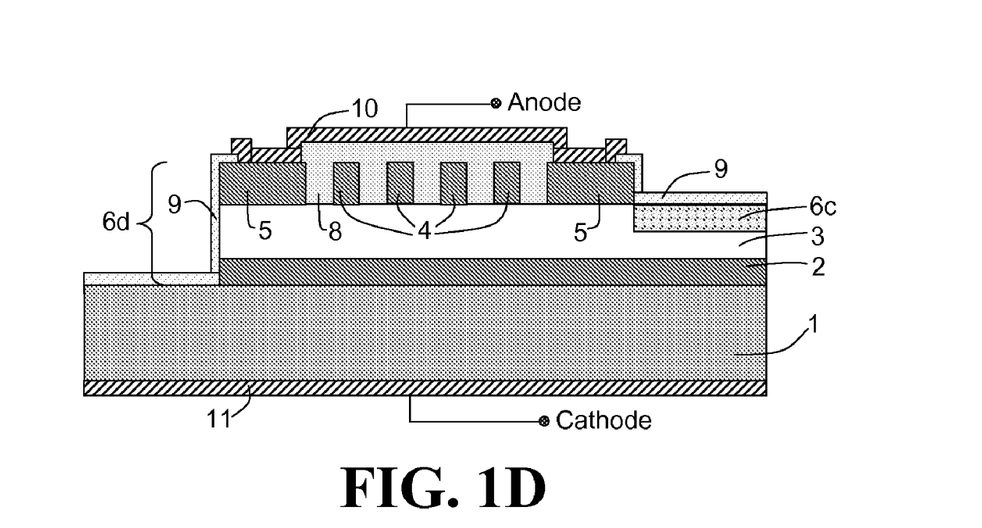
FIG. 1D is an schematic two-dimensional illustration of a JBS rectifier according to one embodiment having only the $P^+$ bus-bar regions exposed and buried $p^+$-n junctions and showing JTE and mesa edge termination.

FIG. 1D is a schematic two-dimensional illustration of a JBS rectifier according to a further embodiment having buried p$^+$-n junctions and exposed P$^+$ bus-bar regions. FIG. 1D also illustrates both junction termination extension (JTE) 6*c* and mesa edge termination 6*d* structures.

Figure 2:
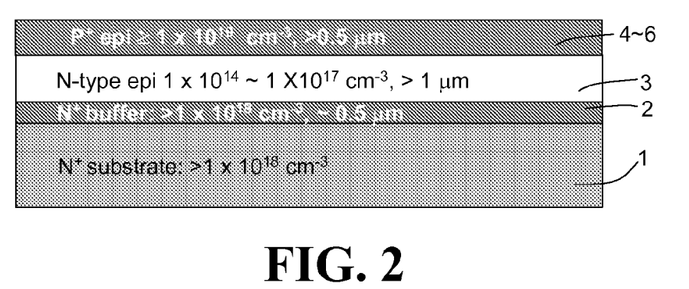
FIG. 2 is a schematic diagram of a starting $N^+$ substrate layer having an epitaxially grown $N^+$ buffer layer, an N-type drift layer, and a $P^+$ layer on the drift layer.

Referring now to FIG. 2, a schematic diagram shows the starting N$^+$ substrate with epitaxially grown N$^+$ buffer, first N-type drift, and P$^+$ layers. A high-quality, heavily doped, thin N$^+$ buffer layer with minimum defect density serves as a good stop of electrical field at the interface of N-type drift and N$^+$ buffer layers. The buffer layer shown in FIG. 2 is optional. The lightly doped N-type drift region provides the blocking capability, while the heavily doped P$^+$ epi-layer forms the p$^+$-n junction that provides the junction barrier. The junction barrier provides for the possibility of conductivity modulation by hole injection to conduct surge currents. P$^+$ epi-layer can also be used to provide edge termination in the form of, for example, guard rings. FIG. 2 also shows representative doping concentrations for each of these layers.

Figure 3A:
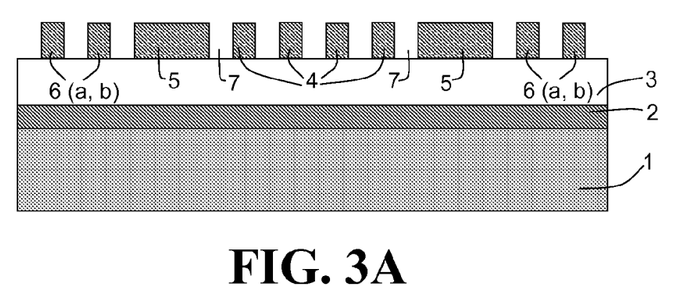
FIG. 3A is a schematic diagram of a device having trenched $P^+$ fingers, bus-bars, and guard rings (as an edge termination structure) which are formed on top of an N-type drift layer.

Referring now to FIG. 3A, the P$^+$ epi-layer can be patterned using a masking material. Exemplary masking materials include, but are not limited to, photo-resists, lifted-off metals, oxides, or any other known materials. As shown in FIG. 3, the P$^+$ layer can then be etched down to the first n-type drift layer 3 to simultaneously form: P$^+$ fingers 4 and trenches 7 for conductivity modulation; one or more P-type external bus-bars 5 that can connect to the P$^+$ fingers 4 for Ohmic metal contact; and P$^+$ guard rings 6(*a*, *b*) for edge termination.

Figure 3B:
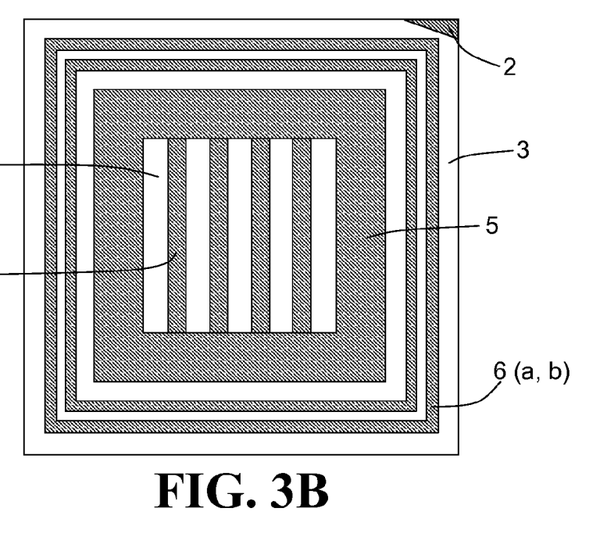
FIGS. 3B and 3C are schematic top views of two embodiments of the device showing two different p-type bus bar arrangements.
Figure 3C:
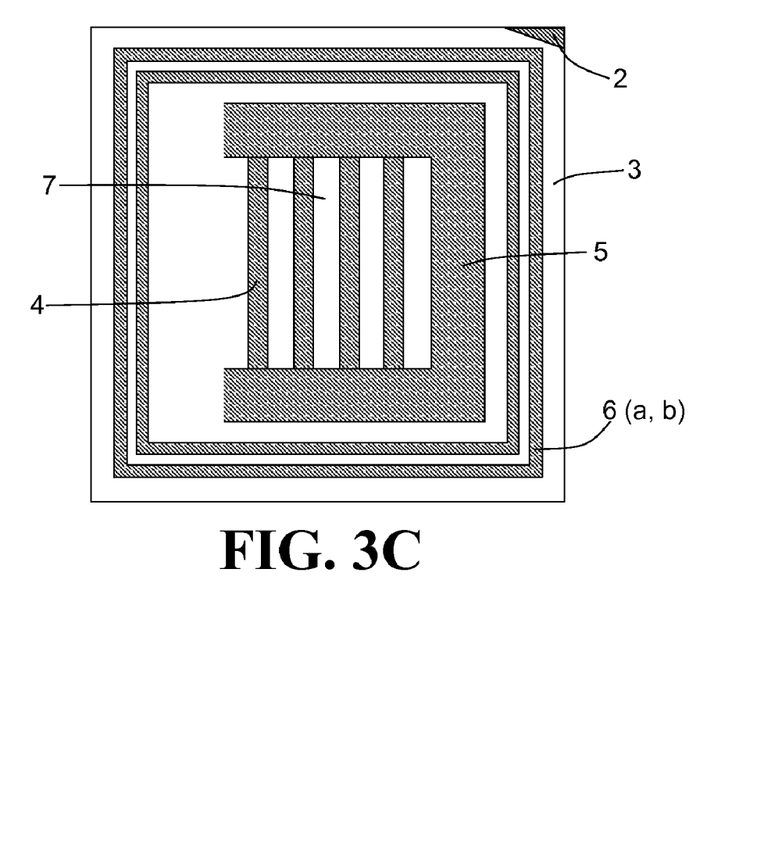

FIGS. 3B and 3C are schematic top views of devices showing two alternative bus bar arrangements. FIG. 3B shows an embodiment wherein the bus-bars 5 circumscribe the p-type regions 4. FIG. 3C shows an alternative embodiment wherein the bus-bars 5 enclose the p-type regions 4 on three sides. Other arrangements of p-type regions 4 and bus-bars 5 are also possible.

Figure 4:
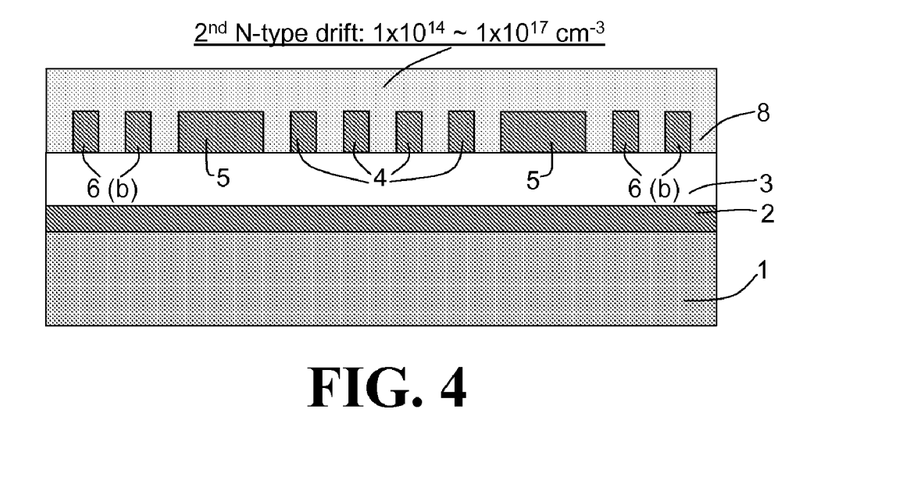
FIG. 4 is a schematic diagram of the $P^+$ finger, bus-bar, and guard ring as an exemplary edge termination being trench-filled and planarized with the $2^{nd}$ N-type drift layer.

Referring now to FIG. 4, the trenched P$^+$ regions are filled and planarized with homoepitaxial N-type semiconductor material to form second n-type drift regions. The doping concentration of these second n-type drift regions can be different from the first n-type drift layer and/or graded for facilitating the degree of depletion of the drift layer and to control the magnitude of the electric field within the junction barrier region. Generally, planarization occurs by optimizing the C/Si ratio and the trench orientation with respect to the direction of the off-cut. The same is true for 4H-SiC cut 8° or 4° off of the basal plane ([0001]) towards the <112–0> direction. The same is true for 6H-SiC cut 3.5° off of [0001] towards the <112–0> direction. The orthogonal orientation of the major flat (i.e., off-cut towards the <11–00> direction) works equally well.

In FIGS. 2-4, the SiC layers can be formed by doping the layers with donor or acceptor materials using known techniques. Exemplary donor materials include nitrogen and phosphorus. Nitrogen is a preferred donor material. Exemplary acceptor materials for doping SiC include boron and aluminum. Aluminum is a preferred acceptor material. The above materials are merely exemplary, however, and any acceptor and donor materials which can be doped into silicon carbide can be used. The doping levels and thicknesses of the various layers of the JBS rectifiers described herein can be varied to produce a device having desired characteristics for a particular application. Similarly, the dimensions of the various features of the device can be varied to produce a device having desired characteristics for a particular application.

Figure 5A:
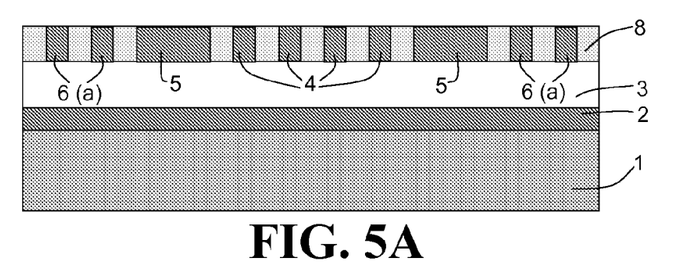
FIG. 5A is a schematic diagram of the $2^{nd}$ N-type drift layer being etched back or patterned then etched back to expose all $P^+$ finger, bus-bar, and guard ring (as an exemplar of edge termination method).
Figure 5B:
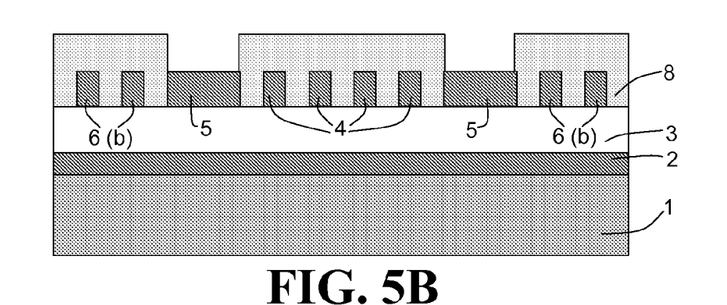
FIG. 5B is a schematic diagram of the $2^{nd}$ N-type drift layer being etched back or patterned then etched back to expose only the $P^+$ bus-bar regions.
Figure 5C:
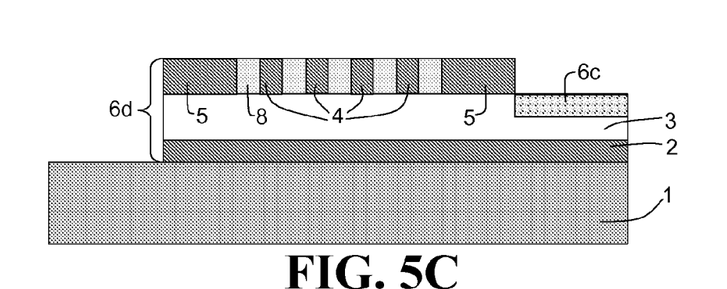
FIG. 5C is a schematic diagram of the $2^{nd}$ N-type drift layers being etched back or patterned then etched back to expose all $P^+$ finger and bus-bar with JTE or mesa edge termination.
Figure 5D:
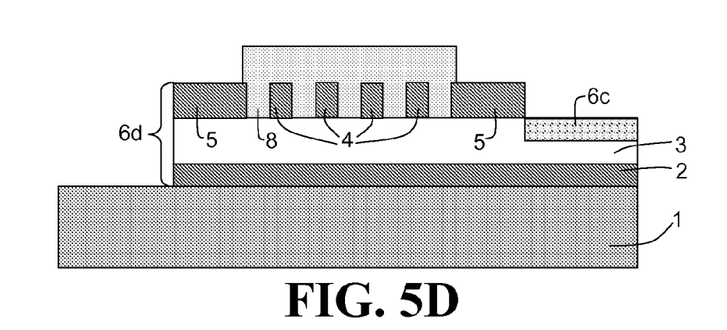
FIG. 5D is a schematic diagram of the $2^{nd}$ N-type drift layers being etched back or patterned then etched back to expose only the $P^+$ bus-bar regions with JTE or mesa edge termination.

FIGS. 5A-5D illustrate devices having either buried P$^+$ fingers (FIGS. 5B and 5D) or exposed P$^+$ fingers (FIGS. 5A and 5C) illustrating various edge termination structures. As shown in FIGS. 5A and 5C, the second N-type drift regions can be patterned and etched down to expose both the P$^+$ fingers 4 and the bus-bar regions 5 for metal contacts. As shown in FIGS. 5B and 5D, the second N-type drift region can be patterned and etched down to expose only the P$^+$ bus-bar regions, resulting in buried p$^+$-n junctions beneath the second n-type drift region. As shown in FIG. 5A, the device can have exposed P$^+$ guard ring regions as an edge termination structure. Alternatively, as shown in FIG. 5B, the device can have buried P$^+$ guard ring regions. FIGS. 5C and 5D also illustrate both junction termination extension (JTE) 6*c* and mesa edge termination 6*d* structures.

Figure 6A:
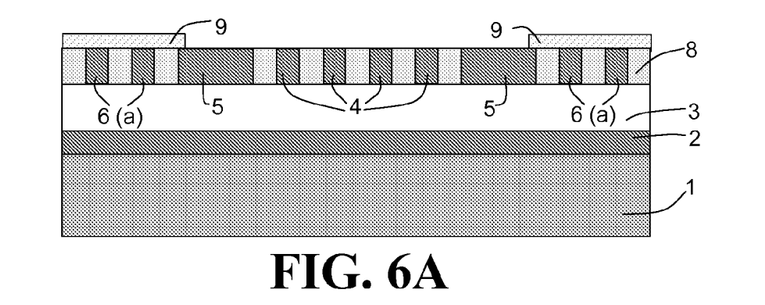
FIG. 6A is a schematic diagram of the dielectric layer(s) being deposited and patterned to form either electrical isolation or passivation on the JBS diodes having exposed $P^+$ finger, bus-bar, and guard ring regions.
Figure 6B:
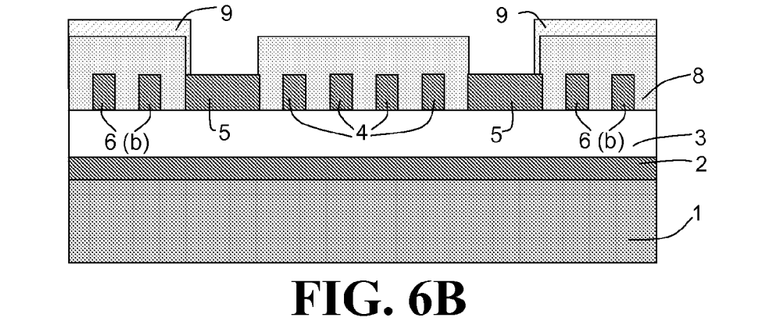
FIG. 6B is a schematic diagram of the dielectric layer(s) being deposited and patterned to form either electrical isolation or passivation on the JBS diodes having exposed only the $P^+$ bus-bar regions and buried $p^+$-n junctions and guard ring.
Figure 6C:
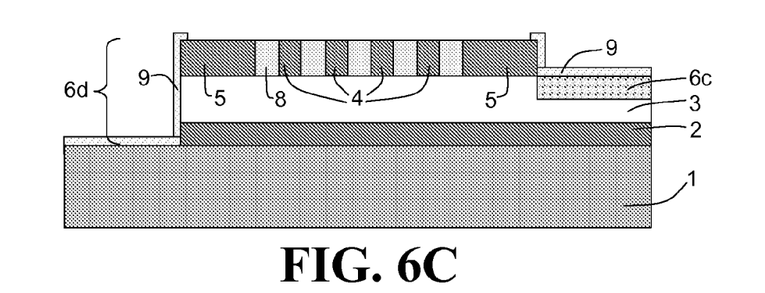
FIG. 6C is a schematic diagram of the dielectric layer(s) being deposited and patterned to form either electrical isolation or passivation on the JBS diodes having exposed $P^+$ finger and bus-bar regions with JTE or mesa edge termination.
Figure 6D:
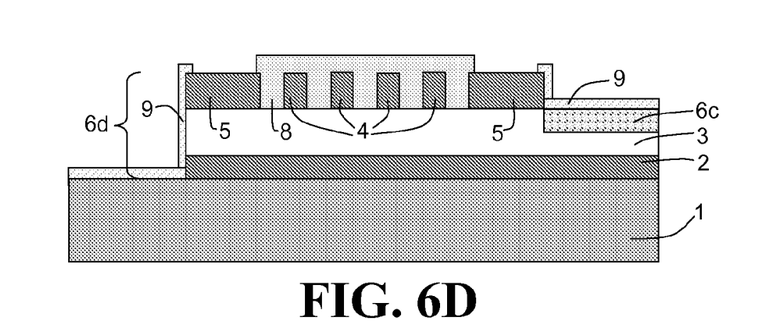
FIG. 6D is a schematic diagram of the dielectric layer(s) being deposited and patterned to form either electrical isolation or passivation on the JBS diodes having exposed only the $P^+$ bus-bar regions and buried $p^+$-n junctions with JTE or mesa edge termination, and to open windows for Schottky and Ohmic metal contacts.

Referring now to FIGS. 6A-6D, a dielectric layer or stack 9 for electrical isolation can then be grown and/or deposited anywhere on the upper surface of the device followed by a patterning and etch through the dielectric layer or stack to open Schottky and Ohmic metal contacts on top of the device. The dielectric layer or stack 9 can be used between different devices fabricated on the same wafer. The dielectric layer or stack 9 can provide electrical field passivation outside the anode metal contact and on top of the edge termination structure. The edge termination structure can be an exposed guard ring as shown in FIG. 6A, buried guard ring regions as shown in FIG. 6B, JTE regions as shown in FIGS. 6C and 6D, or mesa edge termination regions as also shown in FIGS. 6C and 6D.

Figure 7A:
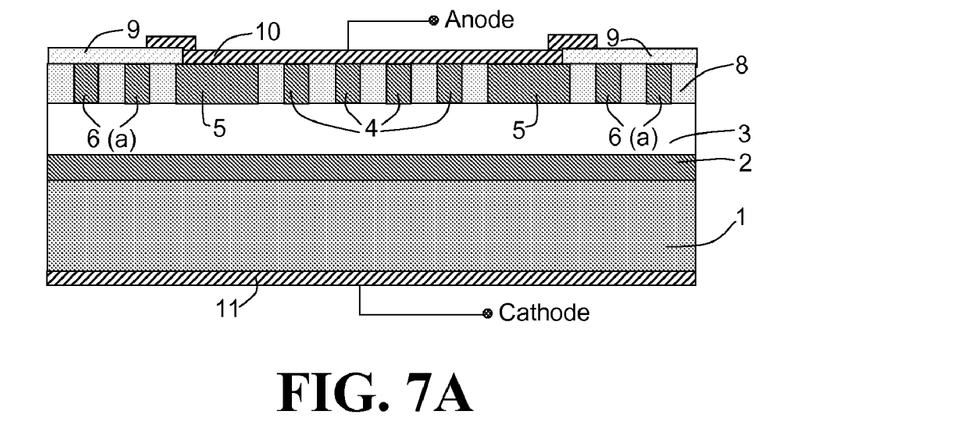
FIG. 7A is a schematic diagram of the metals being deposited to form electrically conducting contacts to the $2^{nd}$ $N^-$ drift regions, all exposed $P^+$ regions, and backside of the substrate on the JBS diodes having exposed $P^+$ finger, bus-bar, and guard ring regions.
Figure 7B:
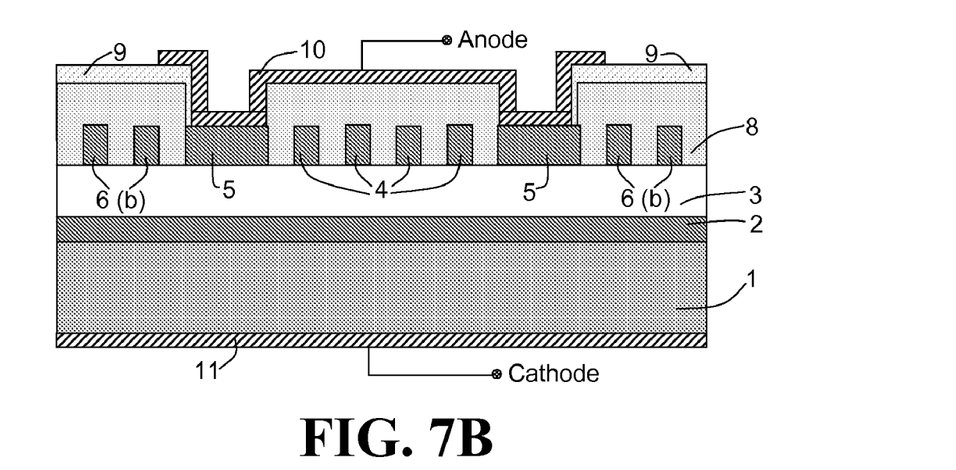
FIG. 7B is a schematic diagram of the metals being deposited to form electrically conducting contacts to the $2^{nd}$ $N^-$ drift regions, all exposed $P^+$ regions, and backside of the substrate on the JBS diodes having exposed only the $P^+$ bus-bar regions and buried $p^+$-n junctions and guard ring.
Figure 7C:
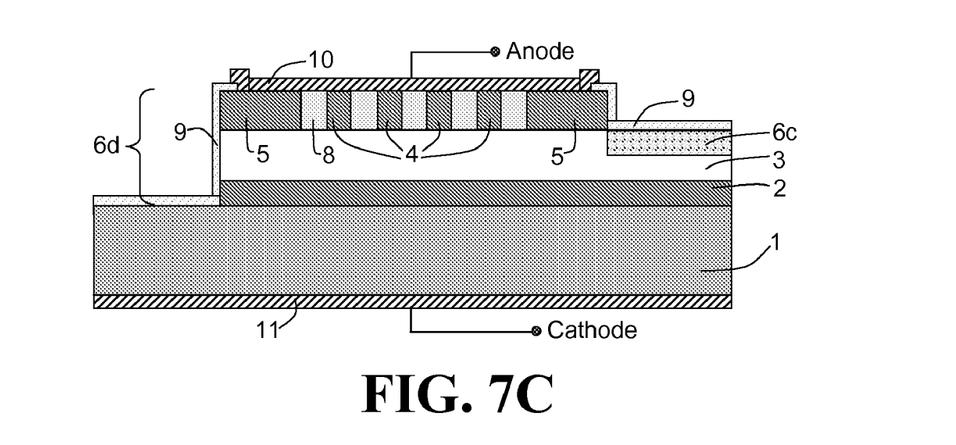
FIG. 7C is a schematic diagram of the metals being deposited to form electrically conducting contacts to the $2^{nd}$ $N^-$ drift regions, all exposed $P^+$ regions, and backside of the substrate on the JBS diodes having exposed $P^+$ finger and bus-bar regions with JTE or mesa edge termination.
Figure 7D:
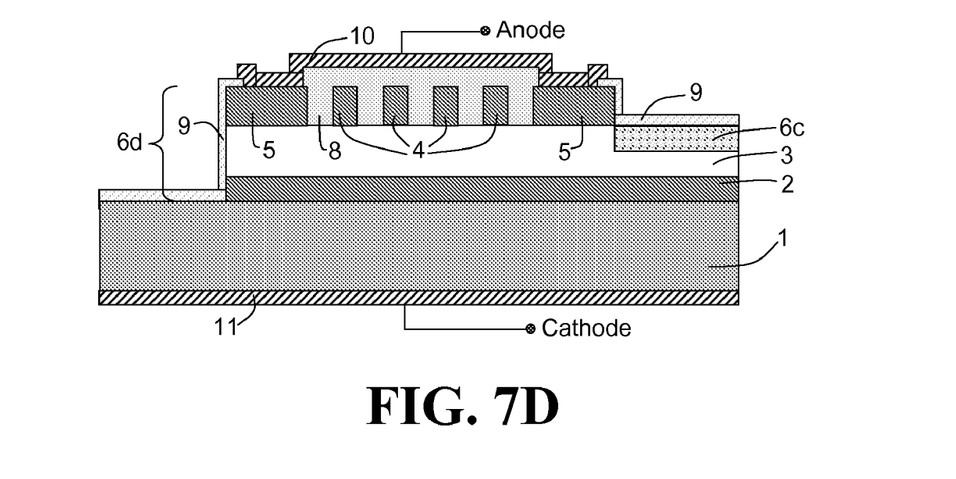
FIG. 7D is a schematic diagram of the metals being deposited to form electrically conducting contacts to the $2^{nd}$ $N^-$ drift regions, all exposed $P^+$ regions, and backside of the substrate on the JBS diodes having exposed only the P+ bus-bar regions and buried p+-n junctions with JTE or mesa edge termination.

As shown in FIGS. 7A-7D, single or multiple metal layers can be deposited on top of the second drift region and bus-bar regions 10 as well as on the backside of the wafer 11. As shown in FIGS. 7A and 7C, metal layer 10 can also be deposited on the exposed P$^+$ fingers 4. The metal layers 10, 11 may consist of one or two different metals or metal alloys or metal mixtures. For example, one metal or alloy or mixture can be used for the Schottky contact to the second n-type drift region and another metal or alloy or mixture can be used to form a good Ohmic contact to both the P$^+$ finger and the P$^+$ bus-bar regions as shown in FIGS. 7A and 7C. Alternatively, the anode can contact only the P⁺ bus-bar regions as shown in FIGS. 7B and 7D. When two different metals are used, an Ohmic metal or metal alloy or metal mixture can be deposited and selectively etched followed by a high-temperature anneal (e.g., >900° C.) to form Ohmic contact to the P⁺ regions prior to the Schottky metal/alloy/mixture deposition. If one metal or metal alloy or metal mixture is carefully selected for simultaneous Schottky and Ohmic contacts formation, a low temperature (e.g., >500° C.) anneal will make Ohmic contact to the P⁺ region without damaging the Schottky contact.

Multiple JBS devices as described herein can be fabricated on the same die for different voltage and current ratings by choosing proper widths of the P⁺ fingers and trenches. In addition, the JBS devices described herein can be monolithically fabricated with other power electronic components (e.g., JFETs or BJTs) on the same die by selectively or blanket re-growing one or more n-type and/or p-type layers, for example an N⁺ layer on top of the second drift region, to form a junction field-effect transistor (JFET) on the same die with the JBS rectifiers, wherein the source and channel regions can be defined by a selectively plasma etch-back of the N⁺ layer and the second N⁻ drift region in sic.

By inverting the electrical polarity of the substrate and the epitaxial layers, a JBS rectifier with an n⁺-p junction can be fabricated using the methods described herein.

The SiC layers can be formed by epitaxial growth on a suitable substrate. The layers can be doped during epitaxial growth.

While the foregoing specifications teaches the principles of the present invention, with examples provided for the purpose of illustration, it will be appreciated by one skilled in the art from reading this disclosure that various changes in form and detail can be made without departing from the true core of the invention.

REFERENCES

[1] K. Shenai, R. S. Scott, and B. J. Baliga, "Optimum Semiconductors for High Power Electronics", IEEE Transactions on Electron Devices, vol. 36, No. 9, pp. 1811-1823, 1989.
[2] R. Singh, S-H Ryu, J. W. Palmour, A. R, Hefer, J. Lai, "1500 V, 4 Amp 4H-Sic JBS Diodes", Proceedings of The 12th International Symposium on Power Semiconductor Devices and ICs (ISPSD '2000), May 22-25, 2000, Toulouse, France.
[3] D. A. Neamen, "Semiconductor Physics and Devices-Basic Principles", Published by Richard D. Irwin, Inc., ISBN 0-256-08405-X, pp. 342-345, 1992.
[4] P. Alexandrov, W. Wright, M. Pan, M. Weiner, L. Jiao, and J. H. Zhao, "Demonstration of High Voltage (600-1300V), High Current (10-140 A), Fast Recovery 4H-SiC p-i-n/Schottky (MPS) Barrier Diodes", Sol. State Electron., Vol. 47, pp. 263-269, 2003.
[5] K. Rottner, M. Frischholz, T. Myrtveit, D. Mou, K. Nordgren, A. Henry, C. Hallin, U. Gustafsson, and A. Schoner, "SiC Power Devices for High Voltage Applications", Mat. Sci. Eng. B, 61-62, pp. 330-338, 1999.
[6] F. Dahlqvist, Lendenmann, and M. Östling, "A JBS Diode with Controlled Forward Temperature Coefficient and Surge Current Capability", Mater. Sci. Forum 389-393, pp. 1129-1132, 1998.

What is claimed is:

1. A semiconductor device comprising:
a substrate layer comprising a semiconductor material of a first conductivity type;
a drift layer on the substrate layer, the drift layer comprising a semiconductor material of the first conductivity type;
a central region comprising a plurality of epitaxially grown regions of semiconductor material of a second conductivity type different than the first conductivity type on a central portion of the drift layer, the regions of semiconductor material of the second conductivity type having upper surfaces and sidewalls; and
an epitaxially over-grown drift region of semiconductor material of the first conductivity type on the drift layer adjacent the plurality of epitaxially grown regions of semiconductor material of the second conductivity type of the central region, wherein the epitaxially over-grown drift region has a different dopant concentration than that of the drift layer;
an ohmic contact on the substrate opposite the drift layer; and
a Schottky metal layer forming a Schottky contact with the epitaxially overgrown drift region of semiconductor material of the first conductivity type, wherein the Schottky metal layer forms an ohmic contact with the semiconductor material of the central region.

2. The device of claim 1, wherein the plurality of epitaxially grown regions of semiconductor material of the second conductivity type of the central region comprise a plurality of elongate segments having a major dimension comprising first and second opposed ends and a minor dimension, wherein the elongate segments are spaced apart from one another along the minor dimension.

3. The device of claim 1, wherein the epitaxially over-grown drift region of semiconductor material of the first conductivity type is also on the upper surfaces of the plurality of regions of semiconductor material of the second conductivity type.

4. The device of claim 1, further comprising a buffer layer comprising a semiconductor material of the first conductivity type on the substrate layer, wherein the drift layer is on the buffer layer and the buffer layer is on the substrate layer.

5. The device of claim 4, wherein the buffer layer has a dopant concentration greater than $1 \times 10^{18}/cm^3$ and/or a thickness of about 0.5 μm.

6. The device of claim 1, wherein the semiconductor material of the substrate layer, the drift layer, the central region and the drift region is silicon carbide.

7. The device of claim 1, wherein the semiconductor material of the first conductivity type is an n-type semiconductor material and wherein the semiconductor material of the second conductivity type is a p-type semiconductor material.

8. The device of claim 1, wherein the drift layer has a thickness greater than 1 μm.

9. The device of claim 1, wherein the central region has a thickness greater than 0.5 μm.

10. The device of claim 1, wherein the central region has a dopant concentration greater than or equal to $1 \times 10^{19}/cm^3$.

11. The device of claim 1, wherein the substrate layer has a dopant concentration greater than $1 \times 10^{18}/cm^3$.

12. The device of claim 1, wherein the drift layer and the drift region each have a dopant concentration of $1 \times 10^{14}/cm^3$ to $1 \times 10^{17}/cm^3$.

13. The device of claim 2, wherein the central region further comprises a first bus-bar region of semiconductor material of the second conductivity type connecting the first ends of the elongate segments and a second bus-bar region of semiconductor material of the second conductivity type connecting the second ends of the elongate segments.

14. The device of claim 13, wherein the first and second bus-bars each have a first width and wherein the raised elongate segments have a second width less than the first width.

15. The device of claim 13, wherein the first and second bus-bars have first and second opposed ends and wherein the first end of the first bus bar is connected to the first end of the second bus-bar by a third bus bar.

16. The device of claim 15, wherein the second end of the first bus bar is connected to the second end of the second bus-bar by a fourth bus bar.

17. The device of claim 1, further comprising a metal layer on the ohmic contact on the substrate opposite the drift layer.

18. The device of claim 1, further comprising an edge termination structure in a peripheral portion of the device.

19. The device of claim 18, further comprising a dielectric layer on the edge termination structure.

20. The device of claim 18, wherein the edge termination structure comprises a region of semiconductor material of the second conductivity type implanted in the drift layer.

21. The device of claim 18, wherein the edge termination structure comprises a mesa edge termination.

22. The device of claim 18, wherein the edge termination structure comprises one or more continuous regions of a semiconductor material of the second conductivity type on the drift layer circumscribing the central region.

23. The device of claim 22, further comprising epitaxially grown semiconductor material of the first conductivity type adjacent the one or more continuous regions of semiconductor material of the second conductivity type circumscribing the central region.

24. The device of claim 23, wherein the epitaxially grown semiconductor material of the first conductivity type is on the one or more continuous regions of semiconductor material of the second conductivity type circumscribing the central region.

25. An integrated circuit comprising:
the semiconductor device of claim 1; and
at least one additional electronic power component formed on the substrate layer.

26. The integrated circuit of claim 25, wherein the at least one additional electronic power component is selected from the group consisting of a bipolar junction transistor (BJT), a junction field-effect transistor (JFET), a metal-oxide semiconductor field-effect transistor (MOSFET), a gate turn-off thyristor (GTO) and combinations thereof.

* * * * *